United States Patent [19]

Weimer

[11] Patent Number: 4,612,580
[45] Date of Patent: Sep. 16, 1986

[54] TDM-INPUT ELECTROMETER, AS IN A LINE TRANSFER CCD IMAGER, USING A CHARGE FUNNEL

[75] Inventor: Paul K. Weimer, Mercer County, N.J.

[73] Assignee: RCA Corporation, Princeton, N.J.

[21] Appl. No.: 650,615

[22] Filed: Sep. 14, 1984

[51] Int. Cl.[4] ............................................. H04N 3/14
[52] U.S. Cl. ....................................... 358/213; 357/24
[58] Field of Search ....................... 358/213, 212, 209; 357/24 LR; 377/60, 62, 63

[56] References Cited

U.S. PATENT DOCUMENTS

| | | | |
|---|---|---|---|
| 3,811,055 | 5/1974 | Weimer | 307/304 |
| 3,904,818 | 9/1975 | Kovac | 358/213 |
| 3,971,003 | 7/1976 | Kosonocky | 340/173 R |
| 4,199,691 | 4/1980 | Angle | 377/63 |
| 4,237,383 | 12/1980 | Kosonocky et al. | 358/213 |
| 4,288,764 | 9/1981 | Ong | 377/63 |
| 4,559,550 | 12/1985 | Koike et al. | 377/62 |
| 4,577,232 | 3/1986 | Hynecek | 358/213 |

FOREIGN PATENT DOCUMENTS 57-60776  4/1982  Japan ................................. 358/213

Primary Examiner—Gene Z. Rubinson
Assistant Examiner—Stephen Brinich
Attorney, Agent, or Firm—Joseph S. Tripoli; George E. Haas; Allen L. Limberg

[57] ABSTRACT

A tendency towards uneven delays in raster scan lines is characteristic of known CCD imagers of line transfer type. This tendency arises owing to a line register being used for the time-division-multiplex selection of rows of charge packets sampling lines of image, and can be compensated to a degree by adjusting the onset of readout of those rows. This tendency towards shear distortion of the television image is eliminated in the disclosed invention by replacing the line register with a charge funnel structure. The charge funnel is a CCD charge transfer channel, wide enough at its input to mate to the output ends of charge transfer channels in the imager register from which it receives charge packets in one or two rows at a time, and narrow enough at its output to increase the in-channel potential variations owing to charge packet transfer therethrough. This increase permits sensitive indications of charge level to be made by an electrometer. The electrometer (e.g., one of floating-diffusion type) supplies these indications as the CCD imager output signal.

13 Claims, 16 Drawing Figures

TDM-INPUT ELECTROMETER, AS IN A LINE TRANSFER CCD IMAGER, USING A CHARGE FUNNEL

FIELD OF THE INVENTION

The present invention relates to electrometers with time-division-multiplex (TDM) charge input circuitry as may be used, for example, in charge-coupled device imagers of the line transfer type.

BACKGROUND OF THE INVENTION

In a line transfer type of CCD imager the image register comprises a plurality of parallelled CCD charge transfer channels in which charge packets representative of a radiant energy image are caused to form. The charge packets in each CCD channel represent a line of image response, and these lines of image response are sequentially transferred from the image register. Transfer may be to a common read-out bus connecting the output electrodes for each of the image registers. A disadvantage of using such a read-out bus is that the output signal-to-noise ratio is diminished because of the high capacitance of the long readout bus. Alternatively, the common read-out bus may be replaced by a CCD charge transfer channel running alongside the imager register, its successive stages arranged for side-loading from respective ones of parallelled charge transfer channels in the image register. The side-loaded CCD charge transfer channel introduces a time skew between the lines in excess of that associated with their being regularly scanned, so delay compensation must be made to avoid shear distortion in a television image reproduced from the imager output signal.

P. K. Weimer, the inventor, in U.S. Pat No. 3,811,055, issued May 14, 1974 and entitled "CHARGE TRANSFER FAN-IN CIRCUITRY" describes a way that charge packets from an array of successively readout parallelled charge transfer channels may be multiplexed to supply a continuous serial flow of charge packets to an electrometer output stage, with each row of charge packets transferred from one of the charge transfer channels subjected to the same delay during read-out as every other row. The fan-in circuitry performing this process is a converging-tree structure of channel merging stages. The channel merging stages are arranged in progressively thinning ranks, with charge packets from adjoining charge transfer channels at the input of each successive rank of channel merging stages being routed to a reduced number of charge transfer channels at its output.

A 2:1 reduction in the number of charge transfer channels in each rank of channel merging stages is particularly described. This type of fan-in circuitry can be used, the present inventor indicates, in time-division multiplexing the charge packets supplied from the image register of a CCD imager of the line transfer type. Each successively selected line of charge packets read out of the image register is, then, routed to a single charge-sensing stage which converts each charge packet to a corresponding video output signal sample. (Note that each channel merging stage receives charge at any given time from one, not both, of the charge transfer channels at its input because of the selection of one row at a time in the imager for read-out.)

In U.S. Pat. No. 3,811,055, it is indicated that nine ranks of successive channel merging stages suffice to combine the output packets successively clocked from up to $2^9$ image register rows, a number larger than the 480 or so active lines in an NTSC television field. A problem that is recognized is that, as the number of rows of charge packets that are to be multiplexed increases (say, beyond four), the outputs of the channel merging stages in succeeding ranks become more widely separated on the semiconductor substrate, making it difficult to continue the successive channel merging further. To deal with this problem diffused islands in the substrate are proposed, to be used as connecting bars for conducting charge packets to the inputs of channel merging stages in the later ranks of the fan-in charge transfer structure.

The long diffused islands are not without associated problems, however. Considering the operation of these diffused islands as analog transmission lines, the length of the diffused islands makes it very difficult to complete the propagation of signal along them within one clocking interval. Accordingly, a CCD structure which would time-division-multiplex the signal charges from common output electrode with the same time delay for each register is desired, which structure avoids long interconnecting buses.

Channel merging stages can be used with time division multiplexing, as just described, or they can be used for merging the output charge packets simultaneously supplied from the output ends of a plurality of input charge transfer channels. In this latter type of channel merging stage, which is the type most often encountered in practice, the output charge packets are the sum of the input charge packets. Accordingly the charge transfer channel coming out of the stage has to accommodate the larger output charge packets. Customarily gate electrode lengths and clocking potential swings are maintained uniform through the channel merging stage. So the width of the gate electrode structures and the underlying charge transfer channel increase, and the the need for increased charge transfer capability is inherently accomodated.

The present inventor has discerned that, where channel merging is used in the time-division-multiplexing of sequentially supplied charge packet trains, the channel merging stage (contrary to the above-described practice) should be narrower at its output end than at its input end. Such a channel merging stage is to be referred to as a "charge funnel". In channel merging stages used in time-division multiplexing, the output charge packets are of the same order of size as the selected input charge packets. The channel merging stage comprises in addition to parallelled input charge transfer channels a further, output charge transfer channel, wide enough at its input to connect from the parallelled outputs of the input charge transfer channels, as in the channel merging stages for summing parallelly supplied trains of charge packets. Clocking potential swings are maintained uniform through the charge merging stage, per custom. But the output charge transfer channel is narrowed to be at its output end only about as wide as the output end(s) of the one or two input charge transfer channels supplying input charge packets at any given time. This narrowing is possible since there is no appreciable risk of overfilling the potential wells induced under the gate electrodes at the narrowed output end of the output charge transfer channel. There is no appreciable risk because charge packets are introduced into the output charge transfer channel from only one or two of the input charge transfer channels at a time.

In accordance with Coulomb's Law, the admission of input charge packets under the wide gate electrodes overspanning the wide input of the output charge transfer stage will, owing to the large capacitance of these gate electrodes, result in very small potential changes under these electrodes. Where charge is taken out of the output charge transfer channel through an end drain, this small potential change presents no problem. But where an electrometer (such as a floating-diffusion type) is used as an output stage, sensitivity of the output stage is adversely affected. Narrowing the width of the output charge transfer channel along with its overspanning gate electrode structures will, at the output end of the output charge transfer channel, again in accordance with Coulomb's Law, restore the sensitivity of potential change in response to input charge packets. So, the sensitivity of the electrometer stage measuring charge packets transferred to the end of the output charge transfer channel will be improved, owing to the narrowness of the charge transfer channel at its output end.

Signal-to-noise improvements are obtained with a narrowing channel merging stage before the electrometer output stage. The greater sensitivity of the electrometer increases output signal strength compared to the noise generated in the electrometer and associated output amplifier(s). But, further, the reduction in the combined areas of the gate electrodes overspanning the channel merging stage when it progressively narrows towards its output end reduces the accumulated dark current charge accompanying the charge sensed by the electrometer. So there is a reduction in the noise associated with variation in dark current charge, which can be a major factor adversely affecting signal-to-noise ratio.

SUMMARY OF THE INVENTION

The invention is embodied in the combination of an electrometer with time-division-multiplex, charge-coupled-device, charge input circuitry of the following nature. A plurality, at least five in number, of input charge transfer channels have their output ends in close-packed parallel arrangement at the input end of an output charge transfer channel. The input charge transfer channels are selectively clocked so that charge packets are transferred from no more than two of them at any one time into the output charge transfer channel. The output charge channel narrows along its length to a width of the same order of size as the width(s) of each of the selected input channel(s) at its (their) output connection to the output charge channel. This narrowing increases the sensitivity of the electrometer, which takes its input from the narrow portion of the output charge transfer channel. Typically this electrometer is of the floating-diffusion type, with the floating diffusion in the narrow portion of the output charge transfer channel preceding a reset gate and reset drain, and with a metal-insulator-semiconductor transistor in common-source or common-drain amplifier configuration to deliver electrometer output signal. This output signal is in response to electric field applied to the transistor gate electrode, which gate electrode is in ohmic contact with the floating diffusion.

The input charge transfer channels may, for example, comprise a light-responsive portion of a CCD imager of line transfer type. Input charge transfer channels will be sequentially selected one at a time in imagers not providing field-to-field line interlace. Input charge transfer channels will be selected in adjacent pairs where apparent line interlace from field to field is used, with adjacent pair selection alternating in phase from field to field. Alternate input charge transfer channels will be successively selected in imagers providing true line interlace from field to field, with the odd-numbered charge transfer channels being read out in odd-numbered fields and the even-numbered ones in the even-numbered fields.

BRIEF DESCRIPTION OF THE DRAWING (In this application the conventions as to directions on a semiconductor substrate employed by CCD device designers will be employed. The top surface of the imager will, no matter what the actual spatial orientation of the imager is, refer to the surface upon which the gate electrode structures are disposed. The opposing surface will be termed the "bottom surface", and the terms "up", "down", "under", "over" etc. are used in accordance with the convention as well. The "top" and "bottom" surfaces are those surfaces that are sometimes referred to as the "front side" and "back side" of the imager by television camera designers. Furthermore, the terms "length" and "width" as applied to CCD gate electrodes are used to indicate a measure in the direction of charge transfer and in the direction normal to charge transfer, respectively.)

DETAILED DESCRIPTION

Figure 1:
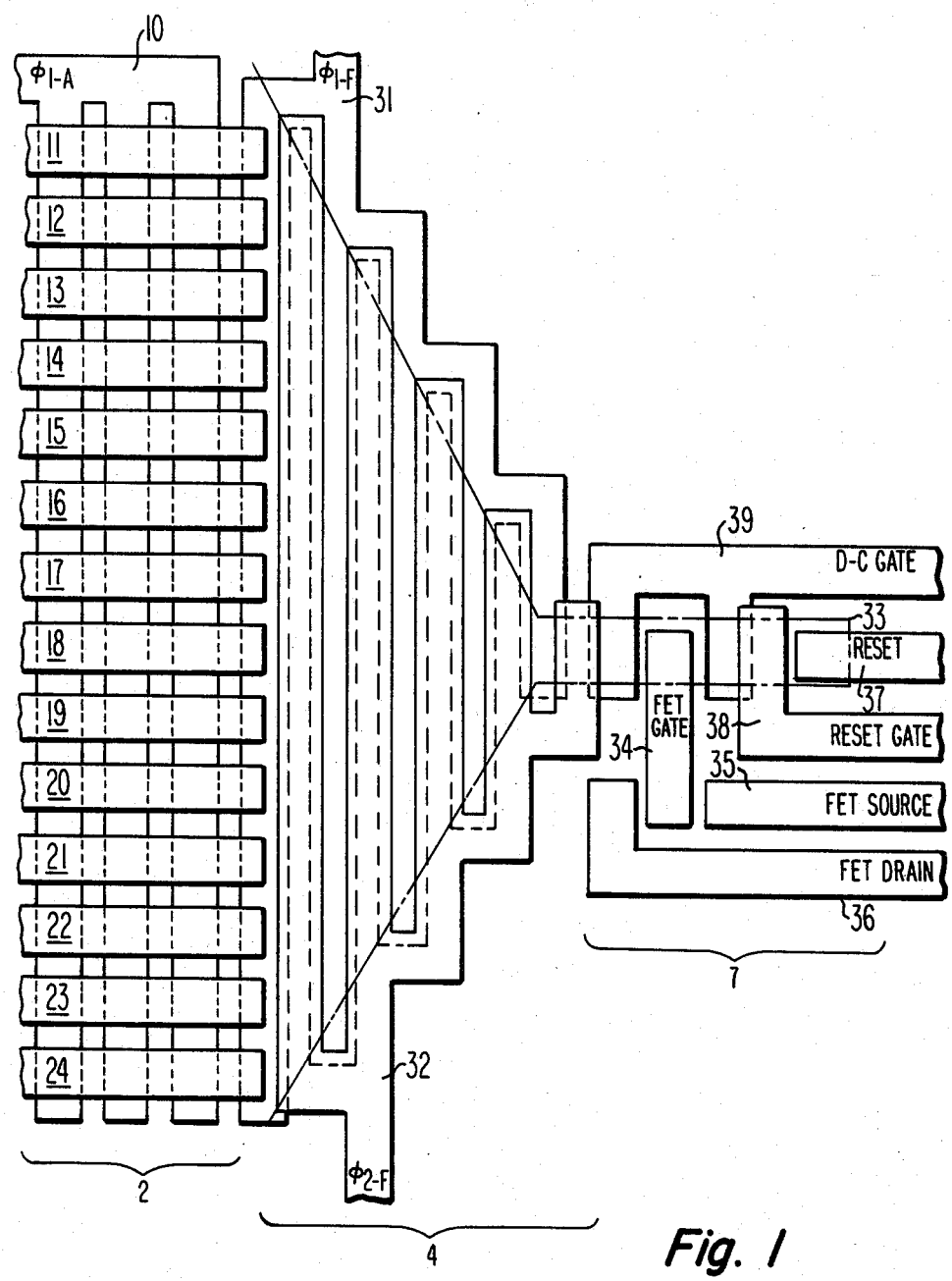
FIG. 1 is a plan view of the gate electrode structure on a portion of the top surface of a CCD imager of line transfer type in which the present invention is employed.

FIG. 1 depicts the gate electrode structures in the output portion of a CCD imager of line transfer type with charge funnel-in output circuitry. The left of FIG. 1 shows the rightmost portion of an image register 2. A charge funnel 4 (of particular concern in the invention) is in the central portion of FIG. 1. The charge funnel 4 is used in the reading out of selected rows of charged packets from image register 2 to introduce those charge packets serially to an electrometer stage 7 of conventional construction, shown at right of figure, which is usually the output stage of the CCD imager. For purposes of illustration, two-electrode, two-phase clocking is presumed to be used, both in the image register 2 and in the charge funnel 4; and two-layer polysilicon gates are presumed in accordance with conventional present-day two-phase CCD construction. Implicit in two-electrode, two-phase construction (though not explicitly shown in FIGS. 1 and 2 to avoid making the drawing over complicated) is the inclusion of diffusion regions under the trailing edges of the gate electrodes, as shown explicitly in the profile section of FIG. 3. These diffusion regions, if shown in FIG. 1, would be vertically disposed to create the asymmetry in the electric field under each of these gate electrodes so that charge transfer always proceeds in the forward direction (i.e., towards the right in FIG. 1). As will be discussed further on, the charge transfer channels in the imager and in the funnel each may be operated in either the "single-clock" or "double-clock" mode.

FIG. 1 is a view looking down on the surface of the semiconductor substrate on which the CCD imager is formed (herein after referred to as the "top surface" in accordance with semiconductor engineering convention). The first layer of polysilicon is separated from this surface by an intervening layer of electrically insulative material. After its selective etching to form a first set of gate electrodes, the first layer is overlaid with another layer of electrically insulative material, over which the second layer of polysilicon is disposed before its selective etching to form a second set of gate electrodes. In preferred forms of the imager, illumination enters unmasked portions of the semiconductor substrate through the surface opposite that on which the polysilicon layers are disposed. In such case, the semiconductor substrate is thinned, so that photoradiation can penetrate through the substrate to provide for photoconversion in the regions under the image register 2.

In the image register 2 the first layer of polysilicon is selectively etched (prior to being overlaid by the second layer of polysilicon) to form a comb structure 10. The teeth of comb structure 10 are a set of parallel gate electrodes, vertically disposed in FIG. 1. A bus connection of ends of these gate electrodes forms the back, or spine, of the comb structure 10 and distributes to the gate electrodes a clock signal $\phi_{1\text{-}A}$.

The second layer of polysilicon in the image register 2 is selectively etched to form another set of parallel gate electrodes, 11 through 24, which cross over the gate electrodes in the first-polysilicon-layer comb structure 10. The gate electrodes in each set are normal to those in the other set. Where the second-polysilicon-layer gate electrodes 11–24 cross over the first-polysilicon-layer electrodes that are the teeth of comb structure 10, the first-polysilicon-layer electrodes will electrically shield the semiconductor substrate from electrostatic induction from the second-polysilicon-layer electrodes. So image register 2 may be considered to comprise a plurality of parallelled CCD charge transfer channels disposed under corresponding ones of gate electrodes 11–24. Normally, channel stops and anti-blooming drains are disposed in the semiconductor substrate between these charge transfer channels.

The gate electrodes 11–24 have potentials applied to them such that, at any given time during field trace interval in the imager output signal, charge integration or accumulation takes place under all except a selected one or pair of adjacent ones of them, which receive a clock signal $\phi_{2\text{-}A}$ complementary to clock signal $\phi_{1\text{-}A}$. Suppose true line interlace is used, or line interlace is not used. The one of gate electrodes 11–24 over the row of charge packets descriptive of the line of image currently being scanned, then, has $\phi_{2\text{-}A}$ applied to it. This conditions the semiconductive substrate thereunder to function as a charge transfer device, shifting those charge packets to the right in the image register 2. The charge packets are shifted one at a time out of image register 2 into the charge funnel 4. Where apparent line interlace is used, an adjacent pair of the gate electrodes 11–24 will be so operated, with the phasing of adjacent pairing being alternated field-to-field to implement line interlace. That is, each line of imager output signal is the sum of two adjacent rows of charge packets accumulated in the image register 2 during the preceding field length of time.

Charge funnel 4 is a charge transfer channel clocked synchronously with the charge transfer channel under each selected one of gate electrodes 11–24. If both the charge funnel and the imager registers are operated in the double clock mode, the first-polysilicon-layer comb structure 31 in charge funnel 4 receives a first phase of clocking $\phi_{1\text{-}F}$ that is synchronous with the first phase of clocking $\phi_{1\text{-}A}$ applied to image register 2. (Indeed one may design so $\phi_{1\text{-}F}$ and $\phi_{1\text{-}A}$ can be identically the same clocking potential.) The second-polysilicon-layer comb structure 32 in funnel 4 receives a second-phase of clocking $\phi_{2\text{-}F}$ that is synchronous with the second phase of clocking $\phi_{2\text{-}A}$ that is, in effect at least, applied to image register 2. $\phi_{1\text{-}A}$ and $\phi_{2\text{-}A}$ are complementary phases of two-phase clocking. $\phi_{1\text{-}F}$ and $\phi_{2\text{-}F}$ are complementary phases two-phase clocking. The teeth of comb structure 31 provide a succession of $\phi_{1\text{-}F}$ gate electrodes normal to the charge transfer channel of charge funnel 4, and the teeth of comb structure 32 provide the $\phi_{2\text{-}F}$ gate electrodes interlaced with those $\phi_{1\text{-}F}$ gate electrodes. The width of the input end of the charge transfer channel through charge funnel 4 is such as to receive charge packets from any of the charge transfer channels under gate electrodes 11–24 in image register 10. The width at the output end of the charge transfer channel through charge funnel 4 is considerably narrower, where it connects to the electrometer output stage 7. The charge transfer channel through funnel 4 is bounded on its sides by portions of a channel stop in the semiconductor stubstrate, which channel stop also encloses portions of electrometer stage 7. The location of this channel stop is indicated by the alternating-short-dash-and-long-dash line 33.

A preferred two-phase clocking scheme is to operate the image register 2 in the single clock mode and the charge funnel 4 in the double clock mode. In the single clock mode one of the two clock "phases" is actually a direct potential, and the other of the two clock phases is alternately positive and negative with respect to that direct potential. Because of the large area under comb structure 10 in image register 2, it is advantageous for conserving clocking power to make $\phi_{1\text{-}A}$ the direct potential clock phase. Then $\phi_{2\text{-}A}$ applied to gate electrodes 11-24 is the alternating clock potential. When gate electrodes 11-24 do not have $\phi_{2\text{-}A}$ applied to them, they receive direct potential to induce carrier collection sites in the portions of the charge transfer channels under them not electrostatically shielded by the teeth of comb structure 10. Clocking charge funnel 4 in double clock mode with $\phi Hd$ 2-A provides for more efficient charge transfer than is obtained with single-mode clocking, with $\phi_{1\text{-}F}$ alternating over the same potential range as $\phi_{2\text{-}F}$. Obtaining as good charge transfer efficiency as possible in charge funnel 4 is of interest in most applications because the transfer distances at the edges of the charge funnel are longer than at its center.

Electrometer stage 7 is shown by way of example as a conventional floating-diffusion and metal-insulator-semiconductor field-effect transistor type. The gate electrode 34 of the field effect transistor (FET) extends (upward in FIG. 1) to cover the floating diffusion in the charge transfer channel portion of the electrometer stage, and electrode 34 ohmically contacts the floating diffusion. Source and drain metal connections 35, 36 ohmically contact the source and drain regions of the electrometer FET disposed in the semiconductor substrate and extend to imager bond pads, not shown, ultimately to connect to an operating supply, one connection (usually the source connection) conventionally being made through the imager load. The end of the charge transfer channel running through charge funnel 4 and electrometer stage 7 terminates in a reset drain diffusion ohmically contacted by a metal connection 37 through which drain potential is applied. The floating diffusion is periodically clamped to drain potential by FET action induced by a reset pulse applied to a reset gate 38 between FET gate 34 and the reset drain. D-C gate electrodes 39 formed in first-layer polysilicon layer flank the electrometer FET gate electrode 34, per custom.

The wide gate electrodes at the input of the charge funnel-in circuitry 4 make its operation appreciably different from the converging tree of charge merger stages, or charge fan-in circuit. As a charge packet is introduced under the first of these wide gate electrodes there is a tendency for it to disperse itself along the width of the gate electrode. At slow clock-through rates the large capacitance of the wide gate electrode (in accordance with Coulomb's Law) would cause the depth of the potential well induced thereunder to be little affected by the introduced charge. However, as the charge transfer channel narrowed later on in the charge funnel 4 and capacitances under the gate electrodes diminished, the transferred charge packet would (again in accordance with Coulomb's Law) tend to cause greater modulation of well depth, thereby to maintain the overall sensitivity of circuitry 4 and electrometer stage 7. That is, the charge dispersion effect does not appreciably affect the collection of the entire charge packet to be applied as input to the electrometer stage 7.

While operation under slow clock-through conditions is feasible for some sorts of slow scanning imager applications, a CCD imager of line transfer type is more likely to be found in rapid scanning imager applications where its low transfer times may be particularly advantageous. At high clock-through rates in charge funnel 4, the short times that a charge packet is under each gate electrode delay its dispersion until the later charge transfer stages where the gate electrodes narrow.

What is important, no matter the clock-through rate in charge funnel 4, is that there is no need for inserting channel stops to inhibit the dispersion of transformed charge in direction(s) normal to charge transfer. Indeed, particularly in imager structures clocked with three or more clock phases so diffusion regions are not needed for preventing reverse charge transfer, it may be advantageous to dope the semiconductive substrate so as to introduce internal drift fields in the charge funnel for accelerating charge carriers away from the funnel walls towards its center. Some channel stops may be used to divide the wide portion of the charge transfer channel through the charge funnel, to avoid sideways dispersion at low clock through rates so that trap states will be less likely to interfere with efficient charge transfer.

Eliminating channel stops between the funnel walls insofar as possible solves a "geometry" problem in imagers where the image register rows are defined so as to be as narrow as possible, a practical desideratum. Upon reflection one will appreciate it is impractical to carry the channel stop structure of the image register forward into a geometrically converging area. To do so, there would be an undesirable requirement to narrow the widths of charge transfer channels down from the effective widths of the charge transfer channels in the image register of the line transfer type of CCD imager. One will also note the charge funnel is geometrically converging without any inherent countertendency for divergence. This contrasts with bucket brigade charge fan-in circuitry as described in U.S. Pat. No. 3,811,055, in which the geometric constraints of lay-out on the semiconductor substrate cause the successively converged charge channels to diverge as the number of successive charge merging steps mounts.

There is a limit on the rapidity with which the width of the charge funnel can converge. Charge along the wall of the funnel has to travel a longer distance $d_w$ during its transfer from being under one gate electrode to being under the next gate electrode in the charge funnel, than the distance $d_c$ that charge in the central portion of the funnel has to travel. The ratio of $d_w$, $d_c$ has a value of $[(w/2l)^2+1]^{(\frac{1}{2})}$ where w is the width of the charge funnel at its input and l is the length over which the charge funnel width linearly converges. At high clock-through rates, loss in charge transfer efficiency will show up primarily at the funnel walls, as $d_w$ becomes long enough that there is insufficient time for full charge transfer.

Presume that a 120° throat angle is possible on the charge funnel; this makes $d_w$ twice $d_c$. If the charge funnel gate electrodes are the same length as those in the image register of a CCD imager of line transfer type, and if the image register has a 3:4 height to width ratio, the charge funnel extends from its input end to its output end a distance equal to about 22% of the width of the image register.

In many CCD imagers of the field transfer type the gate electrodes in the field storage register which follows the image register may be of reduced length, compared to the gate electrodes in the image register, because the channel width constriction imposed by the insertion of anti-blooming drains is removed; the same potential well capacity in achievable in the field storage register as in the image register, then, using slightly wider and shorter gate electrodes in the field storage register than in the image register. Similarly, in the line transfer type of CCD imager, there is no need for anti-blooming drains in the charge funnel. But, further, channel stops between rows can be eliminated, at least in part, in the charge funnel. The resultant effective widening of the potential well under the gate electrodes of the charge funnel can allow for shortened length of those gate electrodes. Accordingly, the length of the charge funnel from input to output end may be reduced somewhat for given input throat width.

While the shortened length of gate electrodes in the charge funnel reduces $d_w$ as well as $d_c$, thus improving charge transfer efficiency, there is a clocking modification that can be taken to improve charge transfer efficiency. The need for this modification will be explained more fully, using FIG. 2 to illustrate that need. As will be discussed in connection with FIG. 4, the modification shown is the inclusion of "booster" gate electrodes along the sides of the charge funnel structure. These booster gate electrodes are clocked in intermediate phase with normal pixel transfer rate clocking to improve charge transfer efficiency.

Figures 2, 3:
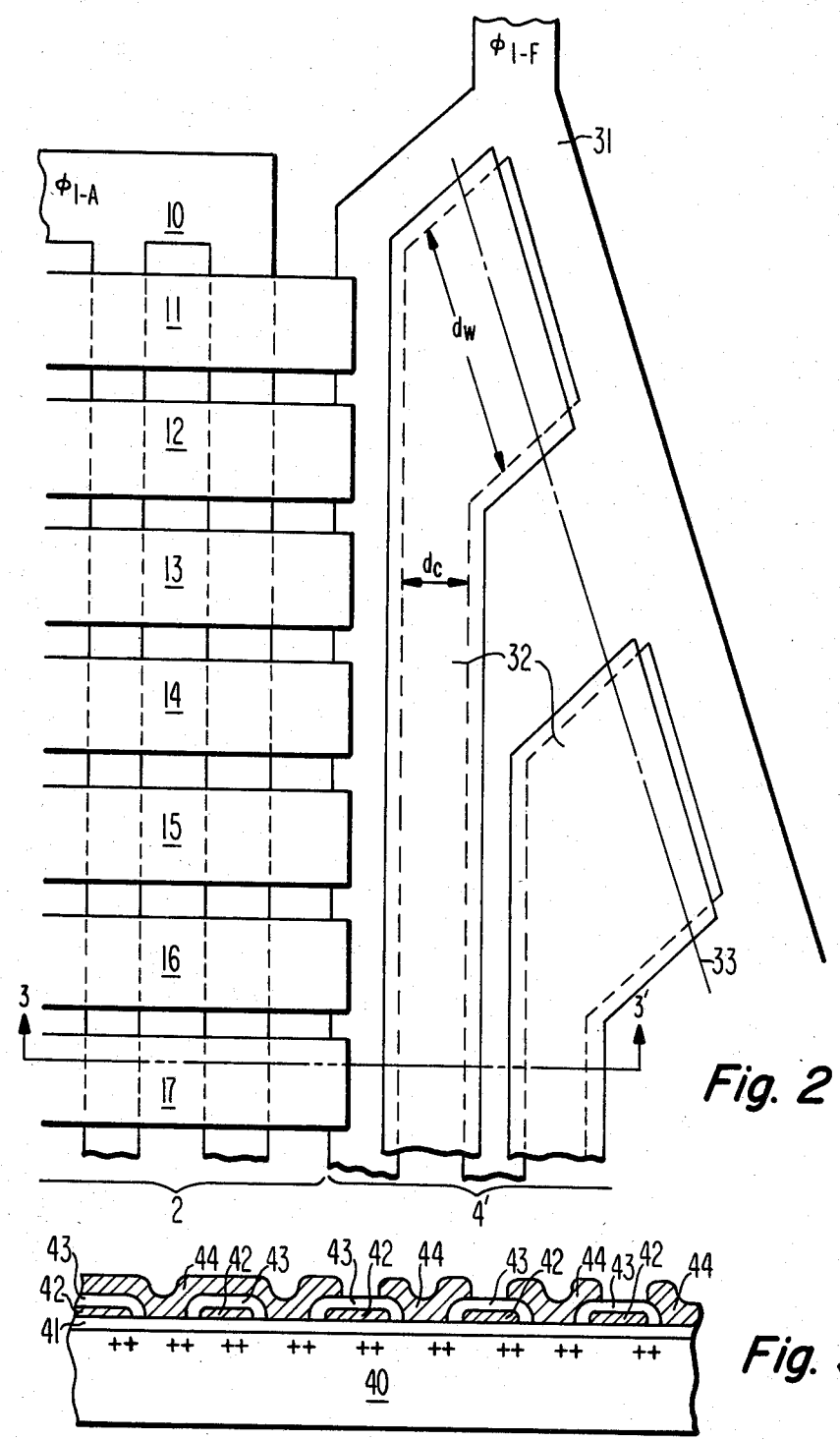
FIG. 2 is a plan view of alternative gate electrode structure at the sides of the charge funnel structure shown in FIG. 1.
FIG. 3 is a section view of FIG. 2 showing the gate electrode structure in profile, in the case where the CCD uses two-electrode, two-phase clocking.

FIG. 2 shows the tip ends of the gate second-polysilicon-layer electrodes that form the teeth of the comb structure 32 in the upper side of charge funnel 4' hooked to the right. The first polysilicon-layer gate electrodes underlying them and forming the teeth of interleaved comb structure 31 are bent at their bases to correspond. Analogously, on the lower side of charge funnel 4' (not shown) the first-polysilicon-layer gate electrodes are hooked over at their tips, and the second polysilicon-layer gate electrodes are bent at their bases. The FIG. 2 modification of the gate electrode structure at the side of the charge funnel illustrates more graphically the difference between the distance $d_w$, which charge must move along the channel stop at the side of the charge funnel, and the distance $d_c$, which charge must move in the center of the charge funnel, during a charge transfer.

The FIG. 3 profile is along section 3—3' in FIG. 2. FIGS. 2 and 3 and the figures are in alignment in the left/right direction. The semiconductor substrate 40 has an electrically insulating layer 41 on its top surface and preferably receives illumination through its bottom surface, to accommodate which the substrate 40 is shown thinned. (Dimensions per convention are not to scale.) The plus signs which appear under the leading edges of the gate electrode structures to be described presently are indicative of the doping variations in the substrate 40 to cause charge transfer only in the forward direction in the two-phase charge transfer structures. A first polysilicon layer 42 is separated into gate electrodes, covered over by a second electrically insulating layer 43. Openings are selectively located in layer 43, and a second layer 44 of polysilicon is laid over layer 43 to fill those openings. Layer 44 is subsequently separated into gate electrodes. A cap insulating layer, not shown in FIG. 3, is subsequently placed over layer 44, and further connections on the imager are usually effected by aluminum metalization. Similar profiles would obtain for the imager shown in plan view in FIG. 1.

Note that in image register 2 at left of FIG. 3, the first-polysilicon-layer gate electrodes shield the charge transfer channel in substrate 40 from the electric fields induced by the portions of the second-polysilicon-layer gate electrode (17 in FIG. 2) crossing over them. So forward charge transfer proceeds essentially the same as in succeeding charge funnel 4' at right of FIG. 3, the profile of which is more conventional for a charge transfer channel.

Figure 4:
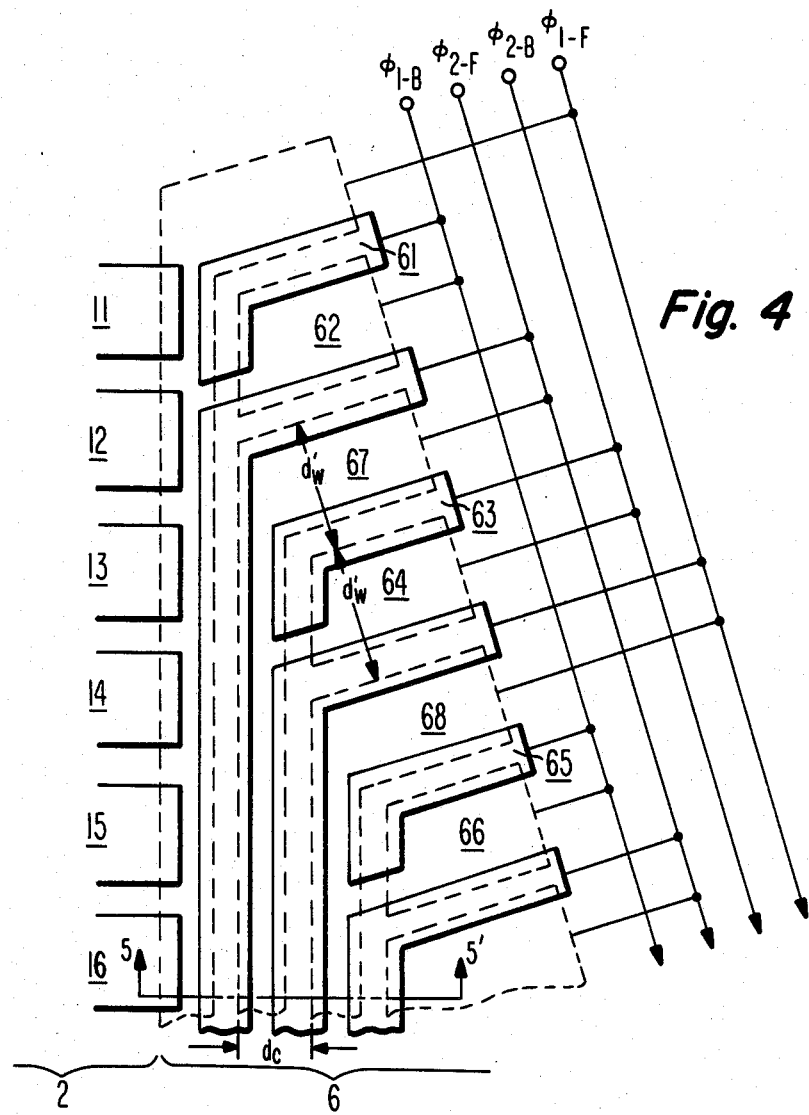
FIG. 4 is a plan view of the gate electrode structure at the sides of the charge funnel structure using four-electrode, two-phase clocking and including "booster" gate electrodes in accordance with a further aspect of the invention.

FIG. 4 shows how additional "booster" gate electrodes along the sides of a charge funnel 6 can reduce the distance over which charge transfer has to be made along the sides to a value $d_w'$ which is only twice the distance $d_c$ over which charge transfer is made in more central portions of the charge funnel. The charge funnel 6 is as a four-electrode, two-phase-clocked type of CCD. As a simplification of the plan view of the gate electrode structure, to facilitate visualization of the concept, the bus connections of the gate electrodes are not shown as reposing in the spine of a comb structure in a layer of polysilicon. Rather, the equivalent electrical connections are shown. One skilled in the art of CCD structure layout on a semiconductor die will realize that the electrical connections can be made by using three parallel feeder busses along each side of the charge funnel, one bus for a respective one of the two phases of clocking signal applied to the gate electrodes extending across the entire charge funnel 6, and the other two busses for the two phases of clocking signal each applied to alternate ones of booster gate electrodes at that side of the charge funnel 6. Another aid to visualizing the concept is that the boundary edges of first-polysilicon-layer electrodes, are shown in their entirety by dotted line, even where not overlapped by second-polysilicon-layer gate electrodes which have their boundary edges shown in solid line.

Transfer gate electrode 61, 63, 65 and storage gate electrodes 62, 64, 66 are booster electrodes. Gate electrodes 63 and 64, for example, allow charge transfer to be made in two steps from a first-clock-phase gate electrode 67 in the first polysilicon layer to a second-clock-phase gate electrode 68 in the same layer. The distance d' of charge transfer in each step is not much longer than the distance $d_c$ of charge transfer in the more central portions of charge funnel 6.

Figure 6:
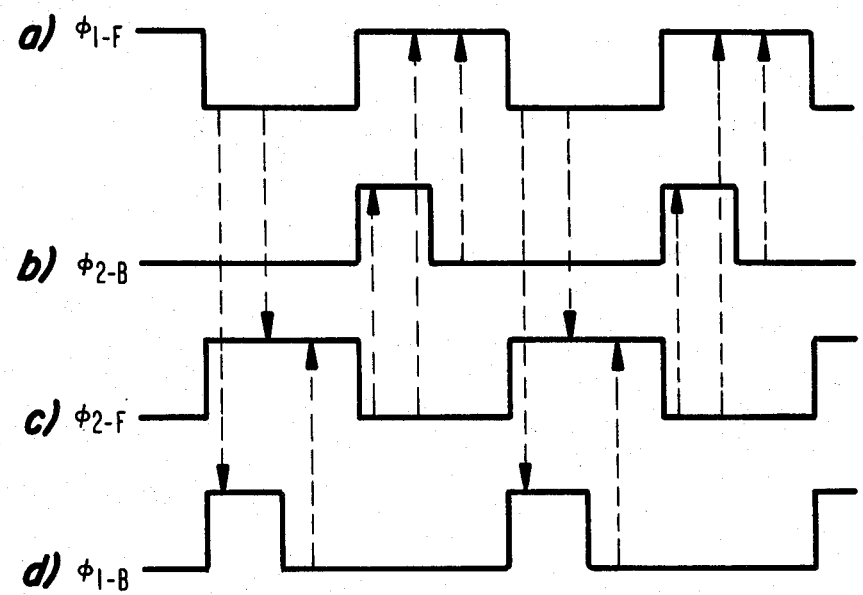
FIG. 6 is a multi-phase clocking diagram of the FIG. 4 charge funnel structure.

FIG. 6 is a clocking diagram for the FIG. 4 charge funnel 6. Portions a, b, c and d of FIG. 6 respectively diagram the $\phi_{1-F}$, $\phi_{2-R}$, $\phi_{2-F}$ and $\phi_{1-B}$ clocking voltages applied to the clocking busses at right of FIG. 4. While the booster gate electrodes are clocked with shorter duration pulses which tend towards requiring lower impedance clock drive to provide adequate clocking pulse definition, the booster gate electrodes have relatively narrow widths. This makes their total associated capacitance low, which tends toward allowing higher impedance clock drive. So, there are only modest additional clocking power requirements for a channel funnel with booster electrodes along its sides.

The charge transfer steps implemented by the clocking voltages $\phi_{1-F}$, $\phi_{2-B}$, $\phi_{2-F}$ and $\phi_{1-B}$ are indicated by the arrows with dashed-line shafts. When $\phi_{1-F}$ clocking voltages falls low, $\phi_{2-F}$ going high will cause transfers of charge forward in the central portions of charge funnel 6, from under gate electrodes receptive of $\phi_{1\text{-}F}$ clock phase to under those gate electrodes receptive of $\phi_{2\text{-}F}$ clock phase, through charge transfer distances no longer than $d_c$. At the sides of charge funnel 6 when $\phi_{1\text{-}F}$ clocking voltage falls low, $\phi_{1\text{-}B}$ going high will cause transfers of charge forward, from under those gate electrodes receptive of $\phi_{1\text{-}F}$ clock phase to under those gate electrodes receptive of $\phi_{1\text{-}B}$ clock phase, through a distance $d'_w$. As $\phi_{1\text{-}B}$ falls low and $\phi_{2\text{-}F}$ remains high, there is another charge transfer step solely at the sides of charge funnel 6 where booster gate electrodes are provided, charge transfer being through an additional distance no greater than $d'_w$ from under gate electrodes receptive of $\phi_{1\text{-}B}$ to under gate electrodes receptive of $\phi_{2\text{-}F}$. At the conclusion of the interval when $\phi_{1\text{-}F}$ is low and $\phi_{2\text{-}F}$ is high, then, all charge packets previously under gate electrodes receptive of $\phi_{1\text{-}F}$ have been transferred essentially in their responsive entireties to under the succeeding gate electrodes receptive of $\phi_{2\text{-}F}$. This has been done in a one-step charge transfer procedure in the central portion of charge funnel 6 and in a two-step procedure along the sides of charge funnel 6 where booster gate electrodes are provided. During the time thereafter when $\phi_{1\text{-}F}$ goes high and $\phi_{2\text{-}F}$ falls low, a similar one-step charge transfer from under the gates receptive of $\phi_{2\text{-}F}$ to under the gates receptive of $\phi_{1\text{-}F}$ takes place in the central portion of charge funnel 6; and a similar two-step charge transfer, along the sides of charge funnel 6. This full cycle of forward charge transfer thusfar described then cyclically repeats.

Figure 5:
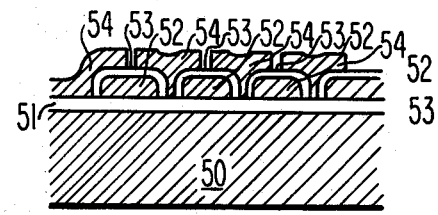
FIG. 5 is a section view of the FIG. 4 charge funnel.

FIG. 5 shows the section 5—5' through a portion of the FIG. 4 CCD imager, which in charge funnel 6 is a conventional profile for four-electrode two-phase clocking. FIGS. 4 and 5 are aligned with each other in the left/right direction. Substrate 50, insulating layer 51, the first-polysilicon-layer 52 gate electrodes and remnant portions of their overlying insulating layer 53, and the second-polysilicon-layer 54 gate electrodes are shown. The cap insulating layer is omitted from FIG. 5.

Charge funnel 6 of FIG. 4 has a throat angle of 138°, substantially wider than the throat angle required to reduce the latency time of the charge funnel sufficiently that switching of dynamic clocking from one row of image register 2 to another is not coupled through the imager substrate to electrometer 7 during line trace portions of electrometer 7 output video signal. It is desirable to further reduce the ratio of effective $d_w$ to $d_c$ towards unity, without throat angle exceeding 120° by any appreciable amount. This goal is facilitated by using a charge funnel in which the direction of charge transfer is determined by the doping in the substrate under the charge funnel gate electrodes differing on the leading and tailing edges of these gate electrodes. This practice reduces the number of successive gate electrodes receptive of the same clock phase from two to just one, allowing more favorable booster electrode layout. Booster electrode layouts where $d_w$ equals $d_c$ become feasible.

Figure 7:
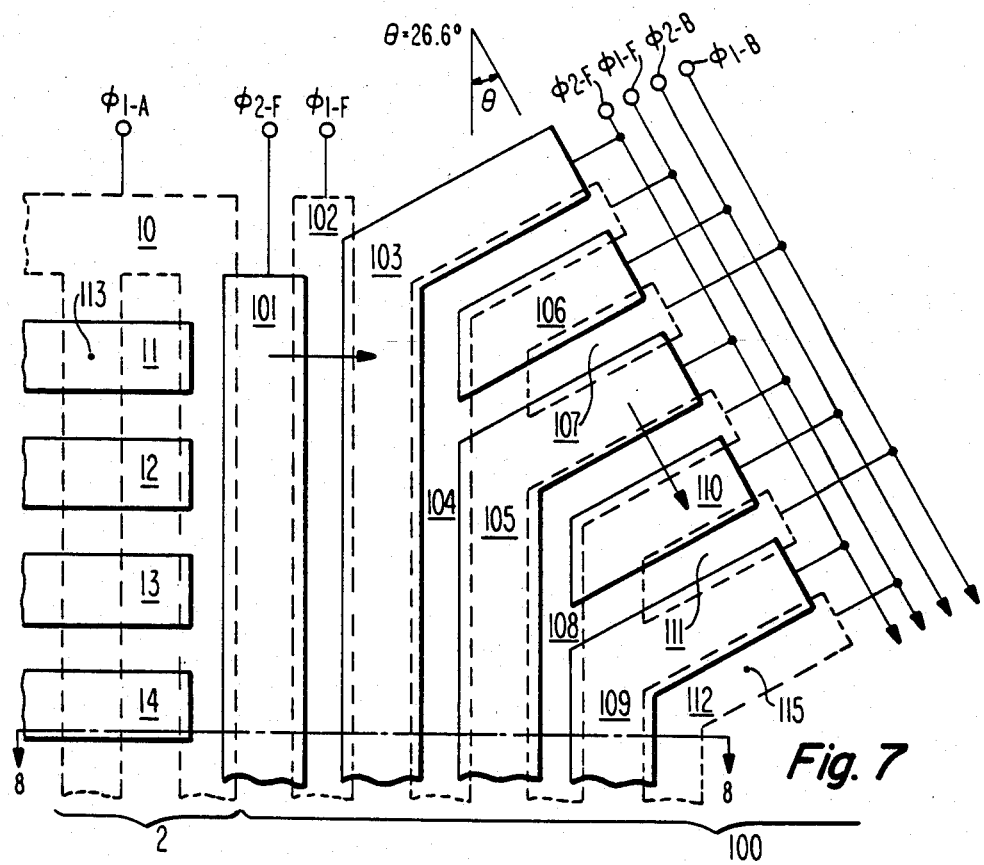
FIG. 7 is a plan view of the gate electrode structure at the sides of a charge funnel using two-electrode, two-phase clocking and including "booster" gate electrodes in accordance with a further aspect of the invention.

FIG. 7 shows in plan view a portion of image register 2 and a portion of an edge of a succeeding charge funnel 100. The first four gate electrodes 101, 102, 103, 104 of charge funnel 100 are followed by a gate electrode 105 in the more central portions of the charge funnel 100. At the upper right edge of charge funnel 100 the first four gate electrodes 101, 102, 103, 104, are followed by two booster electrodes 106, 107, then by gate electrode 105. Gate electrodes 101, 102, 103, 104 and 105 are receptive of clock phases $\phi_{2\text{-}F}$, $\phi_{1\text{-}F}$, $\phi_{2\text{-}F}$, $\phi_{1\text{-}F}$ and $\phi_{2\text{-}F}$, respectively. Gate electrodes 105 and 106 receive booster clock phases $\phi_{2\text{-}B}$ and $\phi_{1\text{-}B}$, respectively. In the more central portions of charge funnel 100 successive gate electrodes 105 and 108 respectively receptive of $\phi_{2\text{-}F}$ and $\phi_{1\text{-}F}$ clock phases are followed directly by successive gate electrodes 109 and 112 respectively receptive of $\phi_{2\text{-}F}$ and $\phi_{1\text{-}F}$ clock phases. At the edge of charge funnel 100 booster gate electrodes 110 and 111 respectively receptive of $\phi_{2\text{-}B}$ and $\phi_{1\text{-}B}$ booster clock phases lie between gate electrodes 108 and 112.

Figure 8:
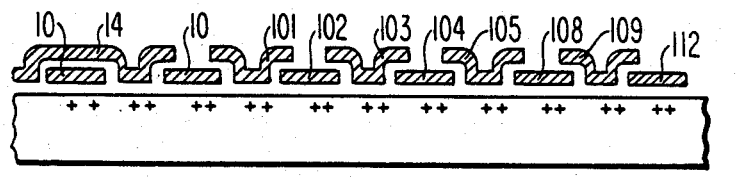
FIG. 8 is a profile view of a central portion of the FIG. 7 imager and charge funnel structure.
Figure 9:
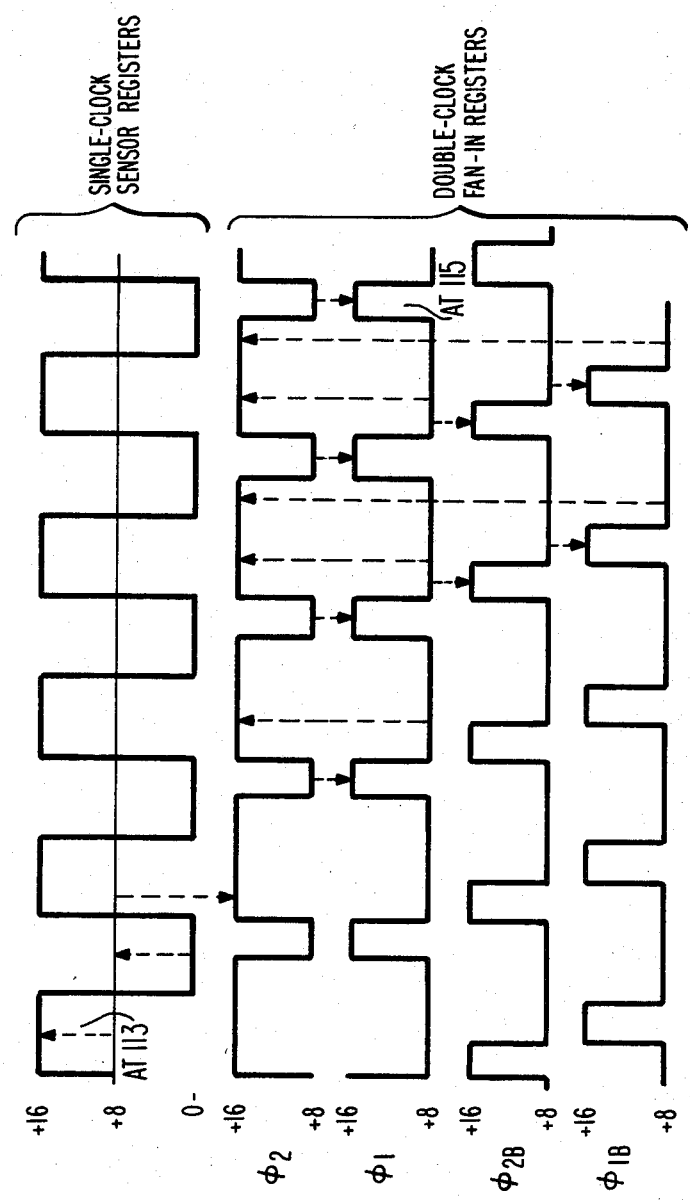
FIG. 9 is a multi-phase clocking diagram of the FIG. 7 charge funnel structure.

FIG. 8 shows a stylized cross section of the FIG. 7 CCD imager portion. FIG. 9 shows the multiphase clocking diagram for moving a charge packet from point 113 in image register 2 to point 115 in the following charge funnel 100. Gate electrode voltages are measured respective to substrate ground. Dotted lines indicate the various charge transfer operations in accordance with the convention used in FIG. 6. The FIG. 7 charge funnel 100 has a throat angle of 126.8° and a latency time of 10.05 microseconds, shorter than the 11.12 microsecond line retrace time of broadcast television.

Figure 10:
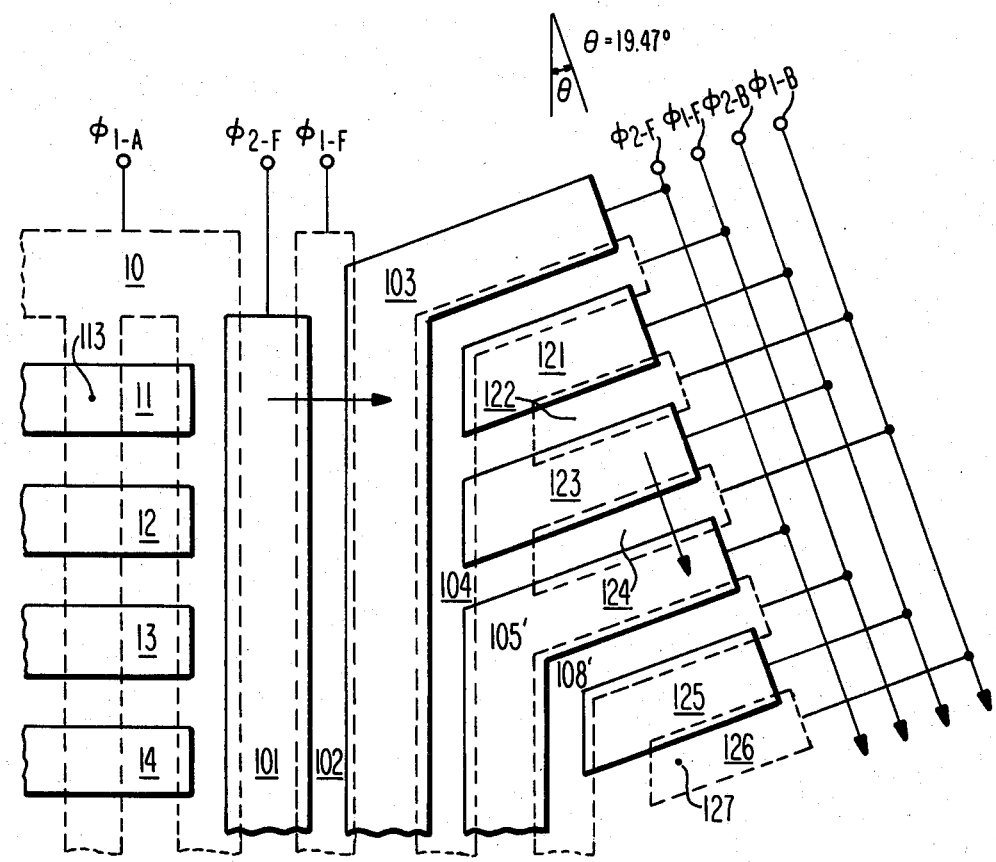
FIG. 10 is a plan view of a modification of the FIG. 7 structure in which booster gate electrodes are clocked at triple normal charge funnel gate electrode clock rate, rather than double that clock rate, in accordance with a further aspect of the invention.
Figure 11:
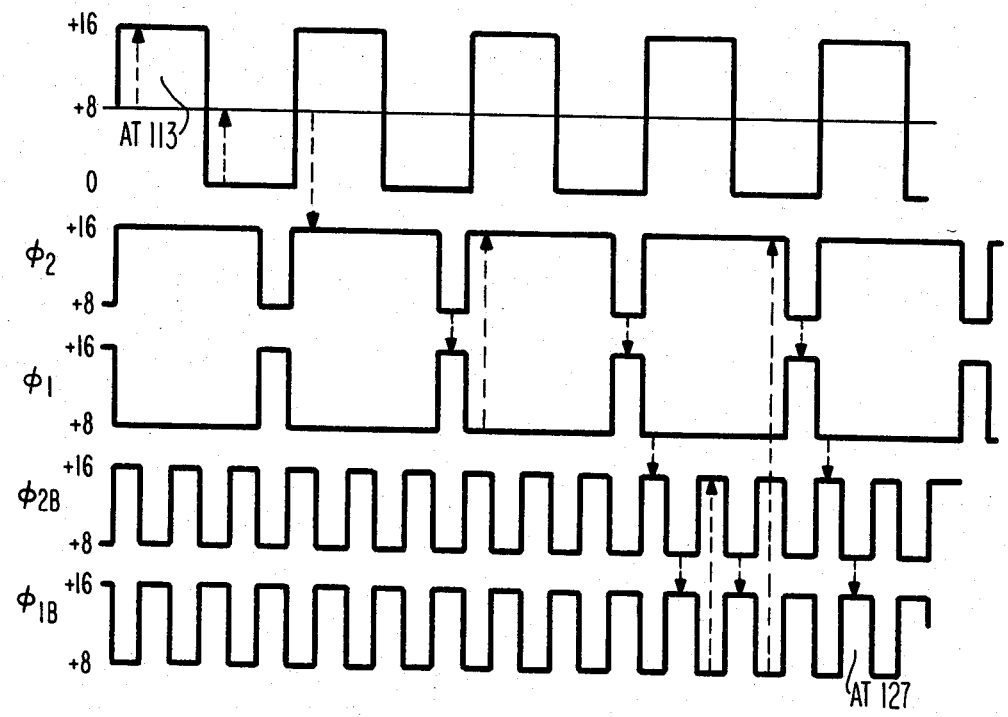
FIG. 11 is a multi-phase clocking diagram for the FIG. 10 charge funnel structure.

FIG. 10 shows in plan view a portion of image register 2 and a portion of a succeeding charge funnel 120. Charge funnel 120 has booster electrodes 121–126 etc. clocked at triple normal clock rate for the gate electrodes extending over the entire width of the charge funnel 120, rather than twice normal clock rate, as was true for charge funnel 6 of FIG. 4 or charge funnel 100 of FIG. 7. FIG. 11 is a multi-phase clock diagram for the FIG. 10 imager, used to illustrate the procedure for moving a charge packet from point 113 in image register 2 to point 127 in the following charge funnel 120.

While the gate electrode structure for the charge funnels have been described as the teeth of interleaved comb structures, it is often desirable to provide interconnection busses along each set of gate electrode ends to allow the gate electrode to be driven from both ends. This facilitates rapid clocking since the resistance portion of the RC time constant of the gate electrodes can be halved. Top aluminization connections to interior portions of the polysilicon gate electrodes may also be used, particularly for the wider gate electrodes at the input end of the charge funnel.

Figure 12:
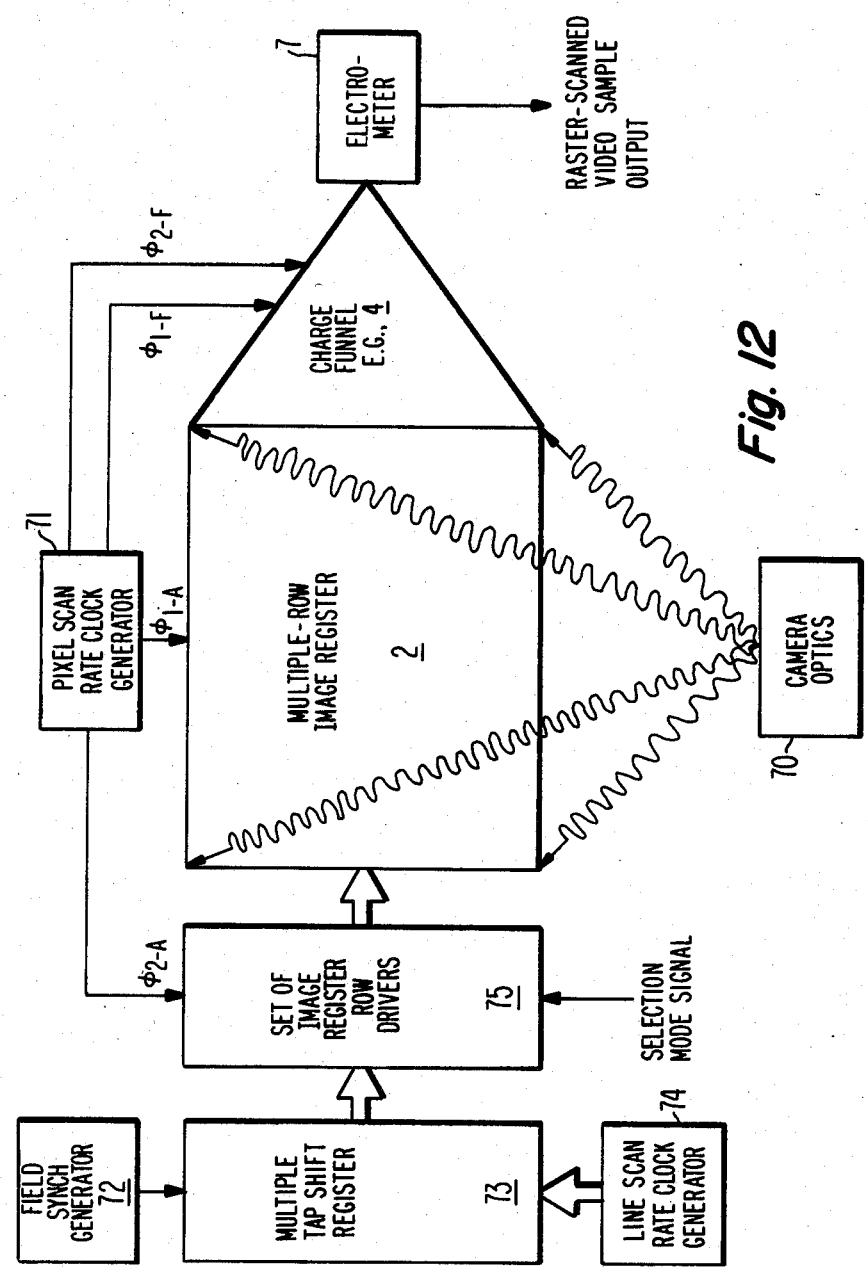
FIG. 12 is a block diagram of a television camera employing a line transfer CCD imager constructed in accordance with the invention.

FIG. 12 provides an overall view of a television camera employing a line transfer CCD imager of the type thusfar described. A radiant-energy (e.g., visible-light) image is projected via camera optics 70 into the image register 2 of the line transfer CCD imager. Image register 2 and the charge funnel (e.g., 4) in cascade thereafter are supplied pixel scan rate clocking 71, normally in two or more phases to advance serially charge packets from each selected row in image register 2 through the charge funnel to electrometer 7. A brief description of how the row selection process in image register 2 can be carried out, when line interlace from field to field is not used, is useful in understanding how line-by-line scanning is provided for in generating the raster-scanned sampled video output signal supplied as response from electrometer stage 7. (Pixel-by-pixel scanning is provided by the serial read-out of charge packets in each row of image register 2 through the charge funnel, of course.)

During field retrace field synchronizing generator 72 introduces field synchronization pulse signal into the input of a multiple-tap shift register 73. This pulse signal is shifted forward from stage to stage in shift register 73 at line scan rate responsive to clocking signal supplied by line scan rate clock generator 74. Shift register 73 may be of a type using metal-insulator-semiconductor field effect transistors or of a type using a CCD so it can be constructed by integrated techniques together with image register 2 and the charge funnel transfer channel. In any case, each stage of shift register 73 corresponds to a charge transfer channel (or row) of image register 2 and a row driver in set 75 of image register row devices. When the pulse signal is in the shift register 73 stage corresponding to a particular charge transfer channel in image register 2, it activates a corresponding row driver stage in set 75 of image register row drivers to apply the alternating $\phi_{2-A}$ clock phase to the one of gate electrodes 11-24 overlying the selected charge transfer channel in image register 2. The row drivers of set 75 may, for example, each comprise a metal-insulator-semiconductor field effect transistor having its channel selectively rendered conductive to apply a $\phi_{2-A}$ clock signal voltage to a selected one of the gate electrodes 11-24, responsive to the gate electrode of the row-driver field effect transistor responding to the stage in shift register 73 associated therewith storing the field synchronizing pulse.

The row selection process for apparent line interlace can be carried out by introducing two successive pulses into shift register 73 at appropriate times in each field retrace interval. The row selection process for the line interlace uses selection mode signal having different values on even fields and on odd fields to selectively enable selective application of $\phi_{2-A}$ clock signal by one set of alternate row drivers in odd fields and by the complementary set of alternate row drivers in even fields.

As pointed out above, the rate at which charge can be converged by a charge funnel has geometric limitation imposed by the lengthening of charge transfer distances at the sides of the charge funnel as the throat angle of the charge funnel increases in the attempt to provide greater charge convergence per unit length. As a result, the charge funnel takes up area on the semiconductor imager die which is a considerable percentage of the area taken up by the image register as the number of lines in the image register increases. In television cameras with 480 active lines that use field-to-field line interlace, it is desired to construct the imager so its image register has 481 parallelled charge transfer channels therein. The charge funnel for a 481 line image register takes up considerable area on the imager die, and the areas on either side thereof are not disposed so as to be filled with other imager elements (e.g., row selection circuitry). A considerably greater amount of clocking power is consumed by such a charge funnel, than for the side-loaded CCD shift register it may be used to replace, owing to the relatively large area under its gate electrodes and the concomitant relatively high total gate capacitance. It is highly desirable, then, to reduce the length of the charge funnel structure and to reduce the gate capacitance to be supplied clocking signal.

For example, presume that a 120° input throat angle is the practical limit for a charge funnel at the frequency it is to be clocked at. This input throat angle makes $d_w$ twice $d_c$ in a charge funnel without booster gate electrodes. If the charge funnel gate electrodes are the same length as those in the image register of a CCD imager of line transfer type, and if the image register has a 3:4 height to width ratio, the charge funnel extends from its input end to its output end a distance equal to about 22% of the width of the image register.

In many CCD imagers of the field transfer type the gate electrodes in the field storage register which follows the image register may be of reduced length, compared to the gate electrodes in the image register, because the channel width constriction imposed by the insertion of anti-blooming drains is removed; the same potential well capacity is achievable in the field storage register as in the image register, then, using slightly wider and shorter gate electrodes in the field storage register than in the image register. Similarly, in the line transfer type of CCD imager, there is no need for anti-blooming drains in the charge funnel. But, further, channel stops between rows can be eliminated, at least in part, in the charge funnel. The resultant effective widening of the potential well under the gate electrodes of the charge funnel can allow for shortened length of those gate electrodes. Accordingly, the length of the charge funnel from input to output end may be reduced somewhat for given input throat width.

There is a further problem concerning the length of the charge funnel 4 that is not alleviated by shortening the gate electrode lengths and widening the throat angle of the charge funnel. The effective number of charge transfer stages in the charge funnel scanned at pixel scan rate fixes the amount of time delay charge packets encounter in their passage through charge funnel 4—i.e., the latency time of charge funnel 4. It is desirable that during image register 2 line trace interval, as it appears delayed at the electrometer 7, there is no start-up or shut-down of dynamic clocking in image register 2, charge funnel 4 and any other CCD devices sharing the same semiconductor-material substrate with electrometer 7. Otherwise, the stray coupling of the clock signal through the substrate to electrometer 7 will cause an undesired response to the change in clocking conditions to accompany the desired response from electrometer 7. This limits the maximum latency time of charge funnel 4 to be no longer than line retrace time in order to avoid the switches of clocking from one row of image register 2 to the next causing disruptions in the electrometer 7 response, which disruptions appear as a vertical stripe in a television image based on that response. In standard U.S. broadcast television practice, where line retrace is eleven microseconds long as compared to fifty-two microseconds long line trace, the charge funnel 4 cannot be longer than 21% as long as the charge transfer channels of the image register 2, supposing one wishes to avoid the switch in row clocking of the image register showing up as a vertical line at the left in a television image based on the FIG. 7 camera video signal. This requires the charge funnel throat angle to be somewhat over 120° for generating video compatible with the broadcast standard directly from the CCD imager without scan conversion, assuming the eleven microsecond line retrace to fifty-two microsecond line retrace standard is adhered to. This avoids the need for a scan converter to expand line scan. Such scan converter is required if one arranges for the line scan to be speeded up in the image register 2, to lengthen the portion of the standard scan line interval available for line retrace in the output signal of the CCD imager, as compared to the portion of that standard scan line interval available for line trace.

To time-division-multiplex output charge packets from a large number of parallelly disposed charge transfer channels, rather than using one charge funnel with a very wide input end and consequently (because of the limitation on rate of convergence in a charge funnel) of substantial length, it is preferable to use a plurality of charge funnels. The charge funnels have their input ends in close packed parallel alignment, each input end having connected to it the output ends of a band of charge transfer channels. (In a line transfer type CCD imager the totality of these bands of charge transfer channels would comprise the image register.) The charge funnels may use separate electrometers to sense charge packets at their output ends with the electrometer output signals then being combined. Alternatively, the output ends of the charge funnels (particularly when only a pair of them are used) may be routed through respective charge transfer channels to a channel merging stage, the output of which connects to the input of an electrometer used to sense the delayed output charge packets from each charge funnel.

Figure 13:
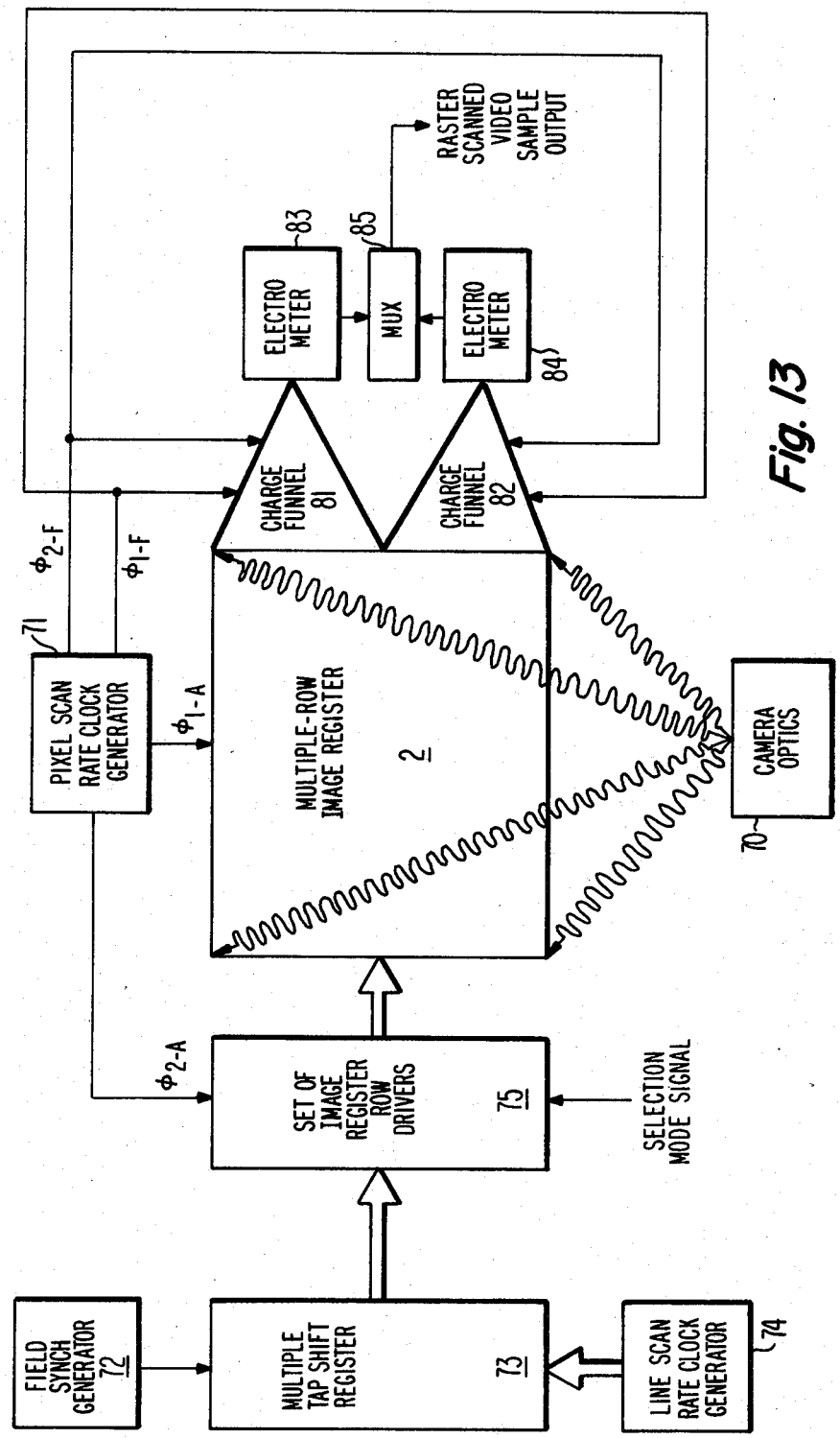
FIG. 13 is a block diagram of a television camera using a line transfer type CCD imager that embodies the present invention and has a plurality of parallelled charge funnels for commutating lines of charge packets out of its image register.

FIG. 13 shows how the single charge funnel 4 of the FIG. 12 camera can be replaced by two charge funnels 81 and 82. Each is half as wide as its input end as charge funnel 4, and commensurately shorter than charge funnel 4, supposing the input throat angles of charge funnels 81 and 82 to be similar to that of charge funnel 4. In FIG. 13 charge funnels 81 and 82 are shown as each continuously receiving pixel scan rate clocking from generator 71 during line scans in the active portions of a field. The lines of charge in the upper half of the image register 2 (as shown in FIG. 13) are successively routed through charge funnel 81 to an electrometer stage 83; then the lines of charge in the lower half of image register 2 are successively routed through charge funnel 82 to an electrometer stage 84.

The output signals from electrometer stages 83 and 84 are then combined to provide full fields of raster-scanned video samples as camera output signal. While this combining of signals could be done by simply summing them, the noise in the charge funnel and electrometer cascade not supplied charge packets from a sampled line or pair of lines would add vectorially to the noise and signal response in the charge funnel and electrometer cascade so supplied. Slightly better signal-to-noise in the CCD imager output signal is provided by using a time-division multiplexer 85 switched at half field rate to combine the output signals supplied by electrometer stages 83 and 84, in apparatus as will be described later on in connection with FIG. 16.

The shorter length of charge funnels 81, 82 as compared to charge funnel 4 is accompanied by a reduction in the latency time of signal passage through a charge funnel. This substantially reduces the problem of the transitions in image register 2 clocking coupling through to the electrometers 83, 84 at the imager output causing spurious response during line trace intervals. This reduction in charge funnel latency time and a reduction of the charge transfer channel area, which reductions are obtained when a plurality of charge funnels are used, makes feasible smaller throat angles for the plural charge funnels. So booster electrodes for these charge funnels and the attendant complexity of bussing gate electrode signals to them can be avoided.

Figure 14:
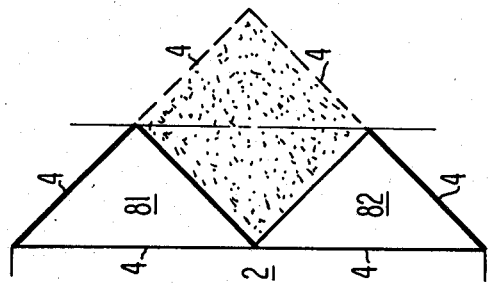
FIG. 14 is a geometric comparison of the area taken upon the semiconductor die by a single charge funnel, as compared to two smaller charge funnels with parallelled inputs, for commutating among the same number of input charge transfer channels.

FIG. 14 illustrates the saving in overall gate electrode capacitance, which depends directly on charge transfer channel area, that is afforded by using two charge funnels 81 and 82, rather than charge funnel 4. The areas of charge funnels 81 and 82 are fully bounded by solid line; that of charge funnel 4 is partially bounded by solid line and partially by dashed line. The boundary lines of the area occupied by replaced charge funnel 4 are identified by the numeral 4 in FIG. 14. The extra area required by charge funnel 4 is shown in stipple and is divided by a center line of alternating short and long dashes. The areas of charge funnels 81, 82 and the areas of the halves of the stippled area are alike; so the combined areas of charge funnels 81 and 82 is seen to be one-half that of charge funnel 4.

In general, replacing a single charge funnel with a plurality, n in number, of parallelled charge funnels will reduce charge funnel area by n times. Multiplying the number of parallelled charge funnels increases the number of electrometer stages required and complicates the problem of matching the electrometer stages, or it complicates the problem of bringing the multiple charge funnel outputs to the inputs of a lesser number of electrometer stages. So once the length of the charge funnelling structure is brought down to an appreciably small fraction of the overall CCD imager dimensions, further parallelling of charge funnels is usually not worth the additional complexity of the electrometer arrangements.

The principal source of noise generated by a charge funnel, such as charge funnel 4 of FIG. 12, is the dark current leakage to each stage from the substrate. These currents would be summed by the converging geometry of the charge funnel yielding an output current whose root-mean-square shot noise is given by:

$$N_f = k(I_L \cdot A_f)^{(\frac{1}{2})} \tag{1}$$

where $N_f$ is the noise generated by the charge funnel,
k is a proportionality constant,
$I_L$ is charge leakage current per unit area, and
$A_f$ is the total area of the charge funnel.

The principal source of noise from the image array arises from charge leakage to the storage area of each pixel, occurring during the 1/30 second frame-time period prior to each scan-out. The accumulation of charge at each pixel causes the total discharge current on scanning to be increased by the factor S the value of which is given by:

$$S = t_F/t_e = n \tag{2}$$

where $t_F$ = the frame time
$t_e$ = the time to scan one pixel
n = the total number of pixels per frame The output noise $N_i$ associated with charge leakage in the image register 2 is therefore given by:

$$N_i = k(I_L \cdot A_e \cdot n)^{(\frac{1}{2})} = k(I_L \cdot A_i)^{(\frac{1}{2})} \tag{3}$$

where k, $I_L$ and n are as defined above,
$A_e$ = the area of one pixel, and
$A_i$ = the total area of the image section.

Dividing (1) by (3) yields the ratio of dark current noise generated by the charge funnel 4 to the dark current noise generated in the image register 2

$$N_f/N_i = (A_f/A_i)^{(\frac{1}{2})} \tag{4}$$

Equation 4 shows that for minimum output noise the area of the charge funnel 4 should be kept as small as possible relative to the image area. Assuming image register 2 to have 3:4 height-to-width ratio and charge funnel 4 to have to have a throat angle of 120 degrees, the ratio $A_f/A_i$ would be 0.1083 and the dark current noise generated by the charge funnel 4 would be 31% of the dark current noise generated by the image register 2. The added noise generated by the charge funnel 4 is acceptably low, then.

In the FIG. 13 camera the two charge funnels 81 and 82 with 120° throat angles would each have an area one quarter as large as charge funnel 4 with 120° throat angle. Dark current noise generated by the selected one of charge funnels 81 and 82 is reduced to 15% of the dark current noise generated by the image register 2.

Figure 15:
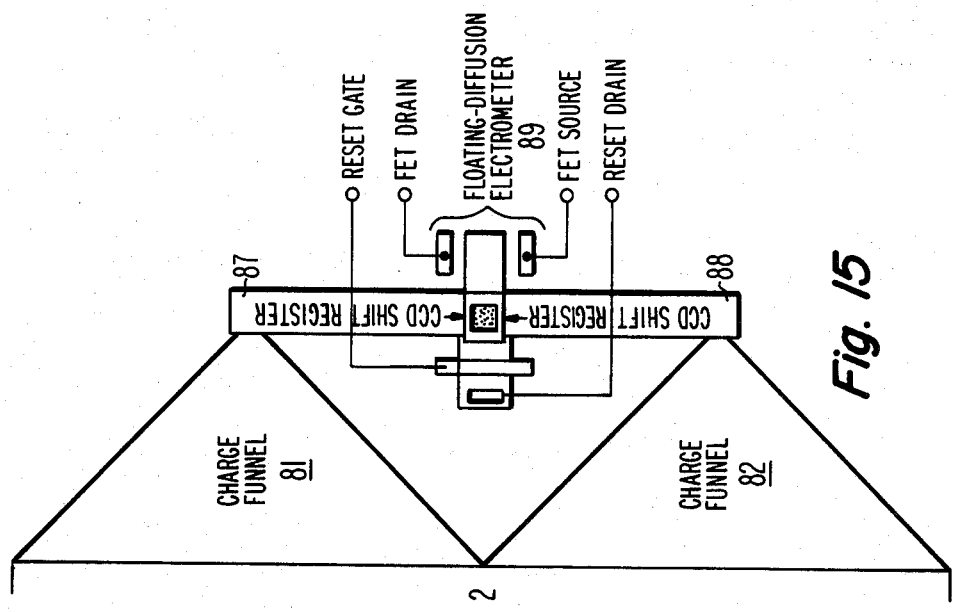
FIG. 15 is a block diagram of a modification that can be made to the FIG. 13 television camera to create a respective further embodiment of the invention.

FIG. 15 shows a modification that may be made to the FIG. 13 camera to avoid the problem of matching electrometer sensitivity characteristics. The use of two electrometers 83 and 84 for respectively sensing charge funnel 81 output and charge funnel 82 output are replaced with a single electrometer 89. The output ends of charge funnels 81 and 82 are connected to electrometer 89 by CCD shift registers 87 and 88, respectively. These shift registers 87 and 88 are dynamically clocked at pixel scan rate, preferably on a continuous basis to avoid the problem of transitions between dynamic and static clocking. The difficulties encountered in the FIG. 15 modification are (a) the necessity for direction change exiting charge funnels 81 and 82 to CCD shift registers 87 and 88, (b) the cross-over requirements of the electrometer connections, and (c) the additional image sample lag caused by clocking through CCD shift registers 87 and 88.

Consider more particularly now the way in which time-division multiplexing is carried forward in the television cameras of FIG. 13 and of FIG. 13 modified per FIG. 15.

Figure 16:
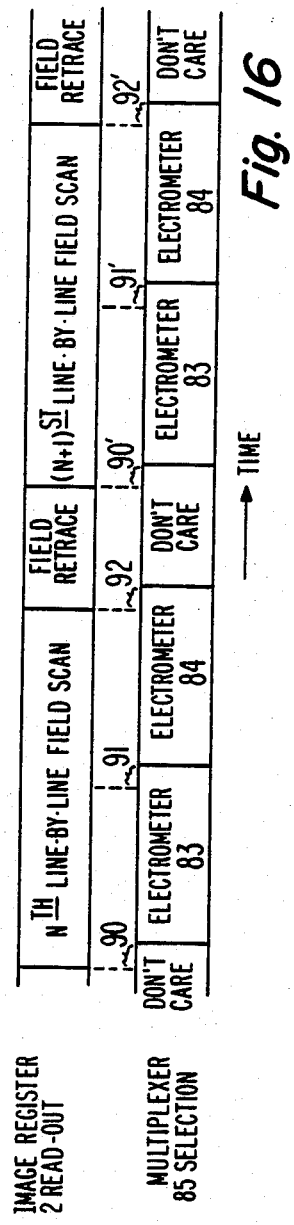
FIG. 16 is a timing diagram for the television camera of FIG. 12.

FIG. 16 is a timing diagram for the FIG. 13 television camera. Time progresses to the right. In the $N^{th}$ line-by-line field scan of image register 2, the selection made by multiplexer 85 may be of electrometer response to either or neither of the charge funnel 81 and charge funnel 82 outputs. This don't care condition lasts for a latency time period 90 for charge packets to pass from image register 2 through charge funnel 81 to electrometer 83, at the close of which period multiplexer 85 selects 91 output for a half field scan time interval. This interval closes a latency time period 91 after the midpoint of the $N^{th}$ field scan, during which latency period 91 charge packets from image register 2 pass through charge funnel 82 and electrometer 84 for selection by multiplexer 85. Multiplexer 85 then selects electrometer 84 output for a half field scan period before the don't care condition again obtains a latency time 92 (for charge funnel 82 to clear of charge packets from image register 2) after field retrace begins. The cycle then repeats as the $(N+1)^{st}$ line-by-line field scan of imager register 2 proceeds.

The FIG. 13 line transfer CCD imager can be modified so one can selectively load the field synchronizing pulse during field retrace, not only into the input stage of shift register 73 which is associated with the first row of image register 2 to be read out through charge funnel 81, but also into a stage at or near the middle of shift register 73 which is associated with the first row of image register to be read out through charge funnel 82. When this alternative way of loading of the shift register 73 is selected, electrometers 83 and 84 are read out simultaneously rather than alternately to allow read-out of all the pixels in image register 2 in spatially multiplexed format in half the time. This type of operation can be employed with a multiplicity of charge funnel and associated electrometer combinations, rather than just two. Arrangements can then be made to select between a number of frame rates, depending on the particular spatial multiplexing and time-division-multiplexing selected. This type of operation is of particular interest in electronic still photography, for example.

One skilled in the art of CCD imager design and armed with the foregoing disclosure will be enabled to design many variants of the charge funnel for multiplexing input charge packets to an electrometer output stage, adapting it for example to any of the many known schemes for clocking forward charge transfer in CCD devices. The use of the charge funnel in related charge packet time-division-multiplexing applications (such as found in CCD memories, for example) will be obvious to him in light of the foregoing disclosure. This should borne in mind when construing the scope of the following claims.

What is claimed is:

1. A CCD imager of line transfer type constructed on a substrate of semiconductive material, said image comprising:
   a plurality of parallelled charge transfer channels arranged with output ends in alignment in an image register, for receiving a radiant energy image projected thereinto;
   a further charge transfer channel progressively narrowing from its input end to its output end, to provide a charge funnel, having an input end of sufficient width to span the aligned output ends of said parallelled charge transfer channels in said image register;
   an electrometer stage with input connection at the output end of said charge funnel and with an output connection from which the output signal from said CCD imager is supplied responsive to charge level at the output end of said further charge transfer channel;
   a plural-gate-electrode structure arranged over said plurality of parallelled charge transfer channels in said image register;
   means applying clock signals to said plural-gate-electrode structure arranged over said plurality of parallelled charge transfer channels for successively clocking rows of charge packets into the input end of said charge funnel;
   a plural-gate-electrode structure arranged over said charge funnel; and
   means applying clock signals to said plural-gate-structure arranged over said charge funnel to transfer charge packets received at the input end of said charge funnel to its output end for sensing by said electrometer stage the in-channel potential levels associated with those transferred charge packets.

2. A CCD imager of line transfer type as set forth in claim 1 wherein said means applying clock signals to said plural-gate-electrode structure arranged over said plurality of parallelled charge transfer channels in said image register is of a type selectively transferring one row of charge packets at a time out of said image register to provide output signal from said CCD imager which has no line interlace from field to field.

3. A CCD imager of line transfer type as set forth in claim 1 wherein said means applying clock signals to said plural-gate-electrode structure arranged over said plurality of parallelled charge transfer channels in said image register is of a type selectively transferring successive adjacent pair of rows of charge packets at a time out of said image register, with pair phasing being alternated from field to field to provide line interlace.

4. A charge funnel charge-coupled device comprising:
- a charge transfer channel disposed in a semiconductor substrate, which charge transfer channel has sides defined by channel stops which converge to narrow said charge transfer channel over its length, in consequence of which said charge transfer channel is several times as wide at its input end as at its output end;
- a succession of gate electrode structures of substantially uniform length, across the entirety of said charge transfer channel bent at their ends so as not only to be normal to the length of said narrowing charge transfer channel in its center but also to be normal to its sides, in consequence of which said gate electrode structures which overlap near the center of said charge transfer channel do not overlap near its sides;
- respective sets of additional gate electrode structures along each side of said charge transfer channel to provide in combination with the succession of gate electrodes across the entirety of said charge transfer channel respective continuous succession of overlapping gate electrode structures along each side of said charge transfer channel;
- means for periodically introducing charge packets under the initial gate electrode structure at the input end of said charge transfer channel; and
- means for applying clocking signals to transfer the charge packets so introduced to the output end of such charge transfer channel, which means comprises
- means for applying conventional clocking signals of relatively long duration to said succession of gate electrodes across the entirety of said charge transfer channel, phased to provide forward charge transfer in the central portions of said charge transfer channel where those gate electrodes across the entirety of said charge transfer channel are overlapping, and
- means for applying additional clocking signals of relatively short duration to said respective sets of additional gate electrode structures along each side of said charge transfer channel, phased with respect to said conventional clocking signals to cooperate therewith to provide forward charge transfer at the sides of said charge transfer channel, whereby the length over which charge transfer takes place during each clocking signal transition is shortened at the sides of said charge transfer channel.

5. A CCD-time-division-multiplexer output stage comprising:
- a plurality of charge funnels having respective input ends in alignment with each other and having respective output ends;
- means for recurrently supplying to the input end of each said charge funnels a succession of charge packet trains;
- means for applying forward clocking signals to each of said charge funnels at least at the times charge packets are supplied to its input end and for a latency time thereafter to move the charge packets thus supplied to its output end; and
- means, sensing the in-channel potential variations at the output ends of each of said charge funnels, for generating the output signal of said CCD time-division-multiplexer output stage.

6. A CCD time-division-multiplexer output stage as set forth in claim 5 wherein said means for generating the output signal of said output stage comprises:
- a respective electrometer for sensing the in-channel potential variations at the output ends of each of said charge funnels; and
- means for combining the responses of said electrometers to generate the output signal of said output stage.

7. A CCD time-division-multiplexer output stage as set forth in claim 6 wherein said means for combining consists of:
- means for time-division multiplexing the output signals from said electrometers together to generate the output signal of said output stage.

8. A CCD time-division-multiplexer output stage as set forth in claim 5 wherein said means for generating the output signal of said output stage comprises:
- CCD shift registers for bringing charge packets from the output ends of ones of said charge funnels to a shared floating element; and
- an electrometer sensing the potential on said shared floating element for generating at least a portion of the output signal of said output stage.

9. A CCD time-division-multiplexer output stage as set forth in claim 5 wherein said means for applying forward clocking signals to each of said charge funnels consists of:
- means for applying forward clocking signals in parallel to said plurality of charge funnels.

10. A CCD imager of line transfer type comprising:
- an image register having a plurality of parallelled charge transfer channels selectively read-out;
- a plurality of electrometers;
- respective charge funnels for connecting to the input of each electrometer a band of parallelled charge transfer channels in said image register; and
- means combining the responses of said electrometers for generating the CCD imager output signal.

11. A CCD imager of line transfer type comprising:
- an image register having a plurality of parallelled charge transfer channels selectively read out;
- an electrometer for generating the CCD imager output signal responsive to charge packets supplied from
- an input bus for said electrometer employing CCD shift registers; and
- respective charge funnels for connecting, to said input bus for said electrometer, the output ends of bands of said parallelled charge transfer channels in said image register.

12. A CCD imager of line transfer type as set forth in claim 11 wherein said charge funnels are forward clocked in parallel.

13. A CCD imager of line transfer type as set forth in claim 11 wherein said charge funnels are forward clocked in parallel.